(12) United States Patent
Clevenger et al.

(10) Patent No.: US 11,276,636 B2
(45) Date of Patent: Mar. 15, 2022

(54) ADJUSTABLE VIA DIMENSION AND CHAMFER ANGLE

(71) Applicant: International Business Machines Corporation, Armonk, NY (US)

(72) Inventors: Lawrence A. Clevenger, Saratoga Springs, NY (US); Koichi Motoyama, Clifton Park, NY (US); Gangadhara Raja Muthinti, Albany, NY (US); Cornelius Brown Peethala, Slingerlands, NY (US); Benjamin D. Briggs, Waterford, NY (US); Michael Rizzolo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 16/528,025

(22) Filed: Jul. 31, 2019

(65) Prior Publication Data

US 2021/0035904 A1 Feb. 4, 2021

(51) Int. Cl.
*H01L 23/522* (2006.01)
*H01L 21/768* (2006.01)
*H01L 23/528* (2006.01)

(52) U.S. Cl.
CPC .... *H01L 23/5226* (2013.01); *H01L 21/76807* (2013.01); *H01L 21/76816* (2013.01);
(Continued)

(58) Field of Classification Search
CPC ............. H01L 23/5226; H01L 23/5283; H01L 21/76807; H01L 21/76831; H01L 21/76877; H01L 21/76816
(Continued)

(56) References Cited

U.S. PATENT DOCUMENTS 6,117,781 A 9/2000 Lukanc et al.
6,540,885 B1 4/2003 Keil et al.
(Continued)

FOREIGN PATENT DOCUMENTS

CN 103646921 A 3/2014

OTHER PUBLICATIONS

English Translation of CN103646921A, Mar. 19, 2014, by Wu Min et al. (6 pages).

*Primary Examiner* — Matthew E. Gordon
(74) *Attorney, Agent, or Firm* — L. Jeffrey Kelly; Michael J. Chang, LLC

(57) ABSTRACT

Chamfer-less via interconnects and techniques for fabrication thereof with a protective dielectric arch are provided. In one aspect, a method of forming an interconnect includes: forming metal lines in a first dielectric; depositing an etch stop liner onto the first dielectric; depositing a second dielectric on the etch stop liner; patterning vias and a trench in the second dielectric, wherein the vias are present over at least one of the metal lines, and wherein the patterning forms patterned portions of the second dielectric/etch stop liner over at least another one of the metal lines; forming a protective dielectric arch over the at least another one of the metal lines; and filling the vias/trench with a metal(s) to form the interconnect which, due to the protective dielectric arch, is in a non-contact position with the at least another one of the metal lines. An interconnect structure is also provided.

17 Claims, 10 Drawing Sheets

(52) U.S. Cl.
CPC .. *H01L 21/76831* (2013.01); *H01L 21/76877* (2013.01); *H01L 23/5283* (2013.01)

(58) Field of Classification Search
USPC .......................................................... 257/774
See application file for complete search history.

(56) References Cited

U.S. PATENT DOCUMENTS

| | | | |
|---|---|---|---|
| 7,632,689 B2 | 12/2009 | Hoster et al. | |
| 8,114,769 B1* | 2/2012 | Srivastava | H01L 21/76813 |
| | | | 438/637 |
| 9,105,641 B2 | 8/2015 | Chen et al. | |
| 9,318,385 B2 | 4/2016 | Uzoh et al. | |
| 9,613,862 B2 | 4/2017 | Lenhardt et al. | |
| 9,691,659 B1 | 6/2017 | Mignot et al. | |
| 2014/0035142 A1* | 2/2014 | Yang | H01L 21/76831 |
| | | | 257/751 |
| 2018/0061700 A1* | 3/2018 | Sun | H01L 21/02063 |
| 2020/0006139 A1* | 1/2020 | Tseng | H01L 21/76877 |
| 2020/0161180 A1* | 5/2020 | Mignot | H01L 21/76829 |
| 2021/0013096 A1* | 1/2021 | Ho | H01L 21/76831 |

* cited by examiner

ADJUSTABLE VIA DIMENSION AND CHAMFER ANGLE

FIELD OF THE INVENTION

The present invention relates to via interconnects, and more particularly, to chamfer-less via interconnects and techniques for fabrication thereof employing a controllable via chamfer angle and dimension with a protective dielectric arch.

BACKGROUND OF THE INVENTION

In semiconductor fabrication, a dual damascene process can be employed to create metal interconnects. In general, a dual damascene process involves patterning features such as vias and trenches in a dielectric, and then filling the features with metal or metals to form the interconnects. When the vias are patterned before the trenches, this is often referred to as a via-first process.

With conventional approaches, however, the vias are typically not protected during the subsequent trench etch step. As a result, the sidewalls of the via are also etched causing chamfering at the top corners of the vias. This chamfering can undesirably lead to shorting between adjacent interconnects.

Thus, techniques for forming interconnects with controlled via chamfer angle would be desirable.

SUMMARY OF THE INVENTION

The present invention provides chamfer-less via interconnects and techniques for fabrication thereof employing a controllable via chamfer angle and dimension with a protective dielectric arch. In one aspect of the invention, a method of forming an interconnect is provided. The method includes: forming metal lines in a first dielectric; depositing an etch stop liner onto the first dielectric over the metal lines; depositing a second dielectric on the etch stop liner over the metal lines; patterning vias and a trench in the second dielectric, wherein the vias are present over at least one of the metal lines and the trench is present over the vias, and wherein the patterning forms patterned portions of the second dielectric and the etch stop liner over at least another one of the metal lines; forming a protective dielectric arch on the patterned portions of the second dielectric and the etch stop liner over the at least another one of the metal lines; and filling the vias and the trench with at least one metal to form the interconnect in direct contact with the at least one of the metal lines and, due to the protective dielectric arch, in a non-contact position with the at least another one of the metal lines.

In one aspect of the invention, a structure is provided. The structure includes: metal lines formed in a first dielectric; an etch stop liner disposed on the first dielectric; a second dielectric disposed on the etch stop liner; vias and a trench patterned in the second dielectric, wherein the vias are present over at least one of the metal lines and the trench is present over the vias, and wherein portions of the second dielectric and the etch stop liner are present over at least another one of the metal lines; a protective dielectric arch disposed on the portions of the second dielectric and the etch stop liner over the at least another one of the metal lines; and at least one metal disposed in the vias and the trench that forms an interconnect in direct contact with the at least one of the metal lines and, due to the protective dielectric arch, in a non-contact position with the at least another one of the metal lines.

A more complete understanding of the present invention, as well as further features and advantages of the present invention, will be obtained by reference to the following detailed description and drawings.

DETAILED DESCRIPTION OF PREFERRED EMBODIMENTS

Figure 1:
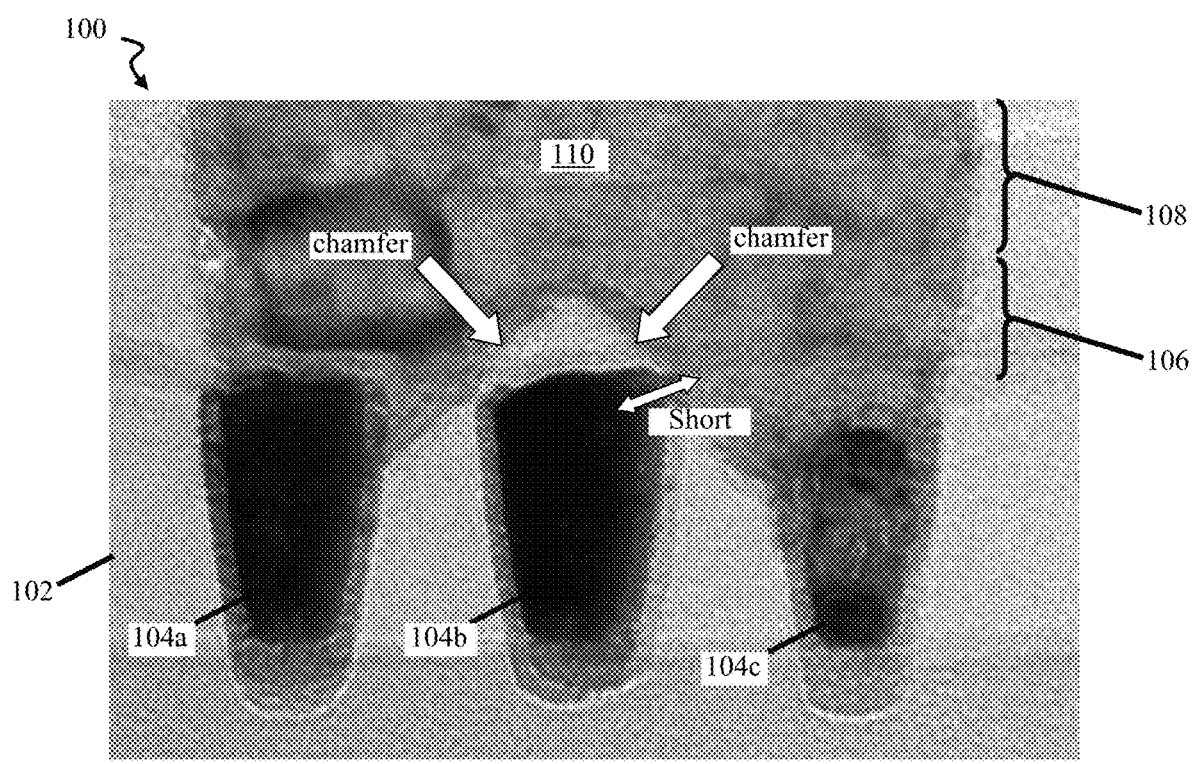
FIG. 1 is an image illustrating how chamfering can undesirably lead to shorting between an interconnect and adjacent structures.

As provided above, conventional dual damascene processes can introduce chamfering at the tops of the vias. As shown in FIG. 1, this chamfering can undesirably lead to shorting between the interconnect and adjacent structures. Namely, FIG. 1 is an image 100 of a device structure having multiple metal lines, i.e., metal lines 104a, 104b and 104c, embedded in a dielectric 102. In this example, the goal is to contact the two outer metal lines (i.e., metal lines 104a and 104c), but not the center metal line (i.e., metal line 104b). To do so, a dual damascene process is employed whereby vias 106 and a trench 108 are patterned in the dielectric 102 with the vias 106 over the two outer metal lines (i.e., metal lines 104a and 104c) and the trench 108 over the vias 106.

However, the problem arises that, if un-protected, the sidewalls of the vias 106 are also etched during the trench 108 etch leading to chamfering of the vias 106. See FIG. 1. This chamfering can undesirably expose the center metal line (i.e., metal line 104b). Thus, when the vias 106/trench 108 are filled with a metal 110, a direct short to the center metal line (i.e., metal line 104b) can form.

Advantageously, provided herein are dual damascene techniques for forming an interconnect structure whereby a protective dielectric arch is formed over the center metal line for chamfer protection and which provides control over the via dimensions. See, for example, FIG. 2.

Figure 2:
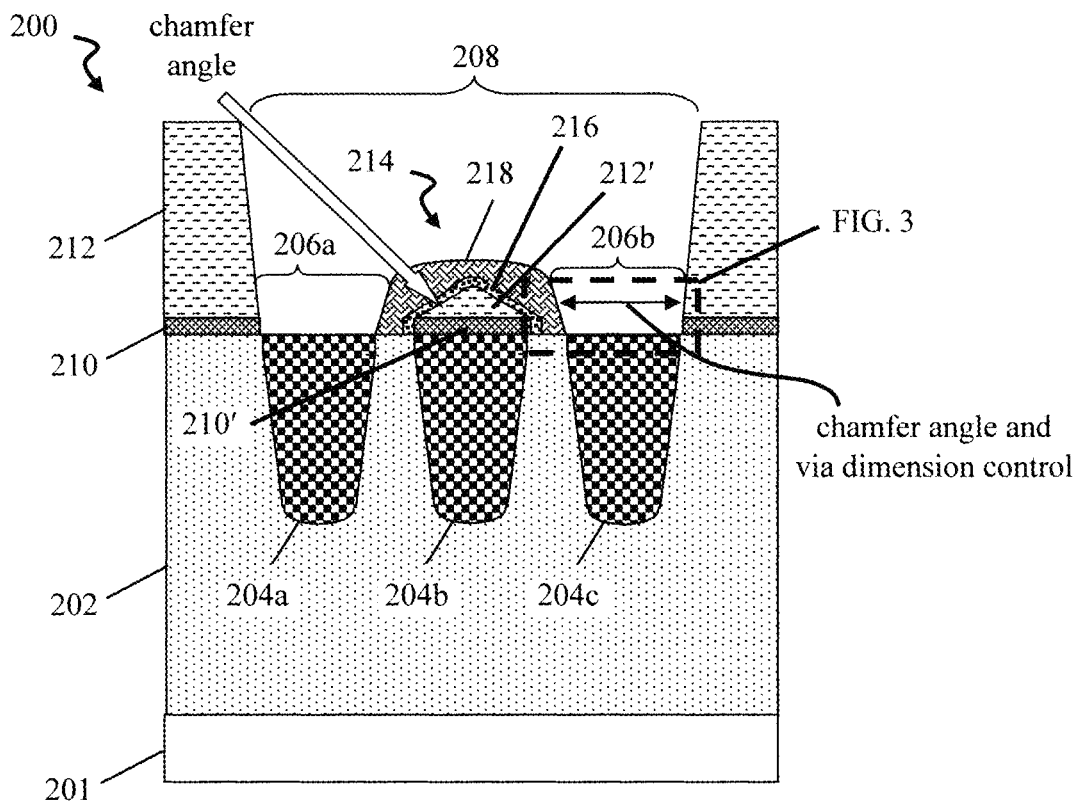
FIG. 2 is a cross-sectional diagram illustrating use of a protective dielectric arch for chamfer protection and control over via dimensions according to an embodiment of the present invention.

FIG. 2 is a cross-sectional diagram illustrating implementation of the present protective dielectric arch for via chamfer protection and dimension control in an interconnect structure 200. As shown in FIG. 2, interconnect structure 200 includes a dielectric 202 disposed on a wafer 201. Multiple metal lines, i.e., metal lines 204a, 204b and 204c, are formed in the dielectric 202.

According to an exemplary embodiment, wafer 201 is a bulk semiconductor wafer, such as a bulk silicon (Si), bulk germanium (Ge), bulk silicon germanium (SiGe) and/or bulk III-V semiconductor wafer. Alternatively, wafer 201 can be a semiconductor-on-insulator (SOI) wafer. A SOI wafer includes an SOI layer separated from an underlying substrate by a buried insulator. When the buried insulator is an oxide it is also referred to as a buried oxide or BOX. The SOI layer can include any suitable semiconductor, such as Si, Ge, SiGe, and/or a III-V semiconductor.

It is notable that, although not explicitly shown in the figures, one or more other device elements may be present in wafer 201. For instance, according to an exemplary embodiment, wafer 201 has at least one device element such as a transistor, a resistor, a capacitor, etc. formed thereon using standard complementary metal-oxide semiconductor (CMOS) fabrication techniques.

Suitable dielectrics 202 include, but are not limited to, oxide materials such as silicon oxide (SiOx) and/or organosilicate glass (SiCOH) and/or ultralow-κ interlayer dielectric (ULK-ILD) materials, e.g., materials having a dielectric constant κ of less than 2.7. By comparison, silicon dioxide (SiO$_2$) has a dielectric constant κ value of 3.9. Suitable ultralow-κ dielectric materials include, but are not limited to, porous organosilicate glass (pSiCOH). According to an exemplary embodiment, dielectric 202 has a thickness of from about 10 nanometers (nm) to about 30 nm and ranges therebetween.

Standard lithography and etching techniques can be employed to pattern trenches in the dielectric 202 which are then filled with a contact metal(s) (followed by polishing process such as chemical mechanical polishing (CMP)) to form metal lines 204a, 204b and 204c. Suitable contact metals include, but are not limited to, copper (Cu), gold (Au), nickel (Ni), platinum (Pt), palladium (Pd) and/or cobalt (Co).

A liner 210 is disposed over the dielectric 202 and (polished) metal lines 204a, 204b and 204c. As will be described in detail below, liner 210 acts as an etch stop during the via etch. Suitable liner 210 materials include, but are not limited to, nitride materials such as silicon nitride (SiN), silicon carbonitride (SiCN) and/or silicon oxycarbonitride (SiOCN). According to an exemplary embodiment, liner 210 has a thickness of from about 5 nm to about 15 nm and ranges therebetween.

A (second) dielectric 212 (where dielectric 202 is the first dielectric) is disposed on the liner 210. Dielectric 212 can be the same or a different dielectric material from dielectric 202. As provided above, suitable dielectrics include, but are not limited to, oxide materials such as SiOx and/or SiCOH and/or ULK-ILD materials such as pSiCOH. According to an exemplary embodiment, dielectric 212 has a thickness of from about 10 nm to about 20 nm and ranges therebetween.

Vias 206a and 206b and a trench 208 have been patterned in dielectric 212. As shown in FIG. 2, vias 206a and 206b extend through the liner 210 and are present over metal lines 204a and 204c, and trench 208 is present over the vias 206a and 206b. Similar to the example presented above, the goal of this dual damascene process is to form an interconnect that contacts the two outer metal lines (i.e., metal lines 204a and 204c), but not the center metal line (i.e., metal line 204b). However, in contrast to the above example, a protective dielectric arch 214 is formed over at least one of the metal line(s) (center metal line 204b in this example) which will not be contacted by the interconnect. Namely, during patterning of trench 208, chamfering of the dielectric 212 occurs along the sidewalls of the vias 206a and 206b. As described above, an aggressive chamfer angle can undesirably expose the center metal line. The protective dielectric arch 214, however, controls (i.e., reduces) the chamfer angle and dimensions of the vias 206a and 206b.

As shown in FIG. 2, protective dielectric arch 214 includes a conformal spacer 216 over patterned portions 212' and 210' of dielectric 212 and liner 210, respectively, above the center metal line 204b, and a dielectric cap 218 disposed on the conformal spacer 216. Suitable materials for the conformal spacer 216 include, but are not limited to, nitride spacer materials such as SiN, SiCN and/or SiOCN. According to an exemplary embodiment, conformal spacer 216 has a thickness of from about 2 nm to about 8 nm and ranges therebetween.

Suitable materials for dielectric cap 218 include, but are not limited to, flowable dielectrics including flowable oxides such as hydrogen silsesquioxane (HSQ) in methyl isobutyl ketone (MIBK). As will be described in detail below, the thickness of the dielectric cap 218 will be regulated (via a pullback etch) to adjust the critical dimension (CD) of the vias 206a and 206b and chamfer angle.

Figure 3:
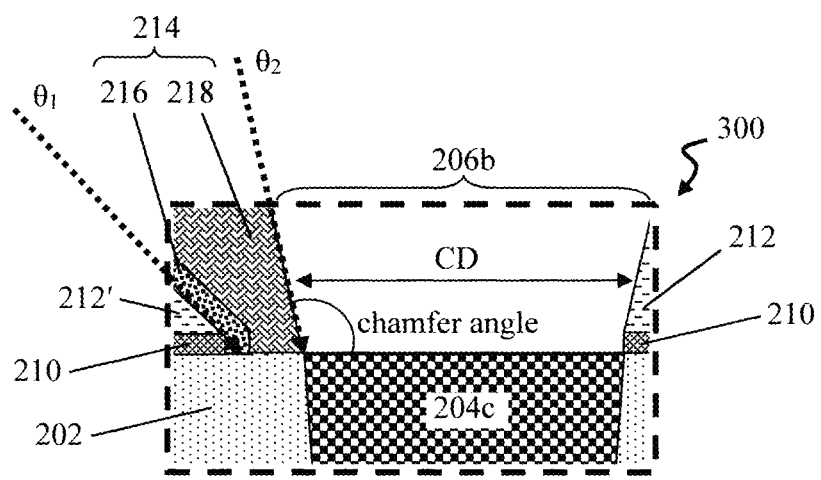
FIG. 3 is a magnified view of the structure of FIG. 2 illustrating how use of the present protective dielectric arch controls chamfer angle as well as via dimensions according to an embodiment of the present invention.

For instance, as shown in the magnified view 300 of via 206b in FIG. 3, the protective dielectric arch 214 (i.e., conformal spacer 216 and dielectric cap 218) controls the critical dimension (CD) of via 206b. Namely, without the protective dielectric arch 214, the via 206b opening would extend between the patterned portion 212' of dielectric 212 to the left and to the right of the metal line 204c. Notably, as shown in FIG. 3, the use of protective dielectric arch 214 (i.e., conformal spacer 216 and dielectric cap 218) also controls the chamfer angle. For instance, without protective dielectric arch 214, via 206b would have a chamfer angle $\theta_1$ based on the angled sidewall of the patterned portion 212' of dielectric 212 over the center metal line 204b. As provided above, an excessive chamfer angle $\theta_1$ can undesirably lead to shorts between the metal lines 204a,b,c. However, implementing dielectric arch 214 controls (i.e., reduces) the chamfer angle to $\theta_2$, wherein $\theta_2<\theta_1$, and provides a protective covering of dielectric over the center metal line 204b.

Figure 4:
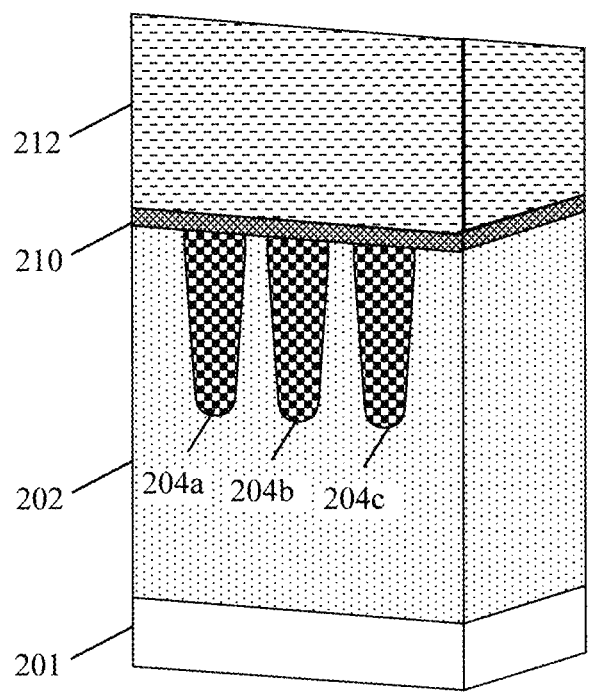
FIG. 4 is a three-dimensional diagram illustrating a first dielectric disposed on a wafer, metal lines having been formed adjacent to one another in the first dielectric, an etch stop liner having been deposited onto the first dielectric over the metal lines, and a second dielectric having been deposited on the etch stop liner over the metal lines according to an embodiment of the present invention.

An exemplary methodology for forming an interconnect structure in accordance with the present techniques is now described by way of reference to FIGS. 4-11. Like structures are numbered alike in the description and in the drawings. As shown in FIG. 4, the process begins with a first dielectric 202 disposed on wafer 201, and metal lines 204a, 204b and 204c having been formed adjacent to one another in the first dielectric 202. As provided above, wafer 201 can be a bulk semiconductor (e.g., Si, Ge, SiGe and/or III-V) or SOI wafer and that, while not explicitly shown in the figures, one or more other device elements (e.g., transistors, resistors, capacitors, etc.) may be present in wafer 201.

According to an exemplary embodiment, first dielectric 202 is SiOx, SiCOH and/or a ULK-ILD material such as pSiCOH, and has a thickness of from about 10 nm to about 30 nm and ranges therebetween. To form metal lines 204a, 204b and 204c in first dielectric 202, standard lithography and etching techniques are employed to first pattern trenches in first dielectric 202 at the locations of the metal lines. A directional (anisotropic) etching process such as reactive ion etching (RIE) can be use for the trench etch.

The trenches are then filled with a metal or combination of metals to form the metal lines 204a, 204b and 204c. For clarity, the designations first, second, third, may be used when referring to metal lines 204a, 204b and 204c, respectively, e.g., whereby metal line 204a (on the left) is referred to as a 'first metal line,' metal line 204b (in the center) is referred to as a 'second metal line,' metal line 204c (on the right) is referred to as a 'third metal line,' and so on. As provided above, suitable metals include, but are not limited to, Cu, Au, Ni, Pt, Pd and/or Co. The metal can be deposited by a process such as evaporation, sputtering, or electroplating. Following deposition, any metal overburden is removed using a process such as CMP. Although not explicitly shown in the figures, prior to depositing the metal into the trenches it is preferable to deposit a liner/barrier layer into and lining the trenches. Suitable liner/barrier materials include, but are not limited to, titanium (Ti), tantalum (Ta), titanium nitride (TiN) and/or tantalum nitride (TaN).

An etch stop liner 210 is then deposited onto the first dielectric 202 over the metal lines 204a, 204b and 204c. A process such as chemical vapor deposition (CVD), atomic layer deposition (ALD) or physical vapor deposition (PVD) can be employed to deposit the liner 210. According to an exemplary embodiment, liner 210 is formed from SiN, SiCN and/or SiOCN, and has a thickness of from about 5 nm to about 15 nm and ranges therebetween.

A second dielectric 212 is deposited on the etch stop liner 210 over the metal lines 204a, 204b and 204c. As provided above, suitable dielectric materials include, but are not limited to, oxide materials such as SiOx and/or SiCOH and/or ULK-ILD materials such as pSiCOH. According to an exemplary embodiment, the same dielectric material is used for both the first dielectric 202 and the second dielectric 212. Use of the same material is, however, not a requirement, and embodiments are contemplated herein where the first dielectric 202 and the second dielectric 212 have different compositions. According to an exemplary embodiment, the second dielectric 212 has a thickness of from about 10 nm to about 20 nm and ranges therebetween.

Figure 5:
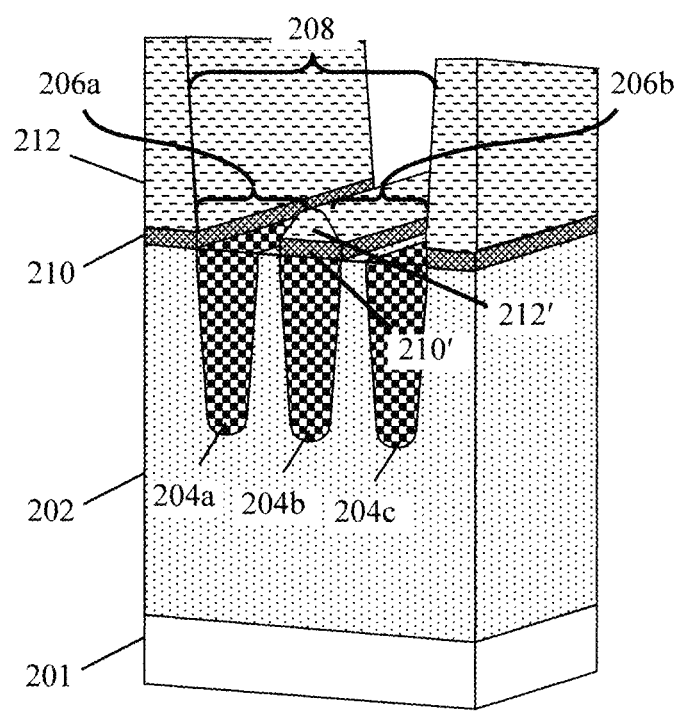
FIG. 5 is a three-dimensional diagram illustrating vias and a trench having been patterned/formed in the second dielectric with the vias having been formed over the metal lines on the left and on the right, and the trench having been formed over the vias, and how the patterning results in portions of the second dielectric and the etch stop liner remaining over the metal line in the center according to an embodiment of the present invention.

An interconnect will be formed in the second dielectric 212 selectively contacting one or more of the metal lines 204a, 204b and 204c, i.e., the interconnect will be in a contact position with at least one of the metal lines 204a, 204b and 204c, and in a non-contact position with at least one other of the metal lines 204a, 204b and 204c. To do so, standard lithography and etching techniques are next employed to pattern/form at least one via 206 and a trench 208 in the second dielectric 212. See FIG. 5. As shown in FIG. 5, vias 206a and 206b are formed over metal line 204a on the left and metal line 204c on the right (and extend through the etch stop liner 210), and trench 208 is formed over the vias 206a and 206b.

The vias 206a/206b and trench 208 can be formed in the second dielectric 212 in any order. For instance, when the vias 206a and 206b are patterned in the second dielectric 212 first followed by the trench 208, this process is referred to as a via-first process. Conversely, when the trench 208 is patterned first in the second dielectric 212 followed by the vias 206a and 206b, this process is referred to as a trench-first process. The steps involved in implementing either a via-first or a trench-first dual damascene process are well known to those of skill in the art, and thus are not described in further detail herein.

As shown in FIG. 5, following patterning of vias 206a/206b and trench 208, a portion 212' of the second dielectric 212 and a portion 210' of the etch stop liner 210 remain over the center metal line 204b. These patterned portions 212'/210' will help insulate the center metal line 204b from the interconnect that will be formed in the vias 206a/206b and trench 208. The goal of the present example is for the interconnect to be in a contact position with the left and right metal lines 204a and 204c, and in a non-contact position with the center metal line 204b. However, as provided above, chamfering along the sidewalls of the vias 206a/206b can expose the top corners of the center metal line 204b undesirably leading to direct shorts between the interconnect and the center metal line 204b.

Figure 6:
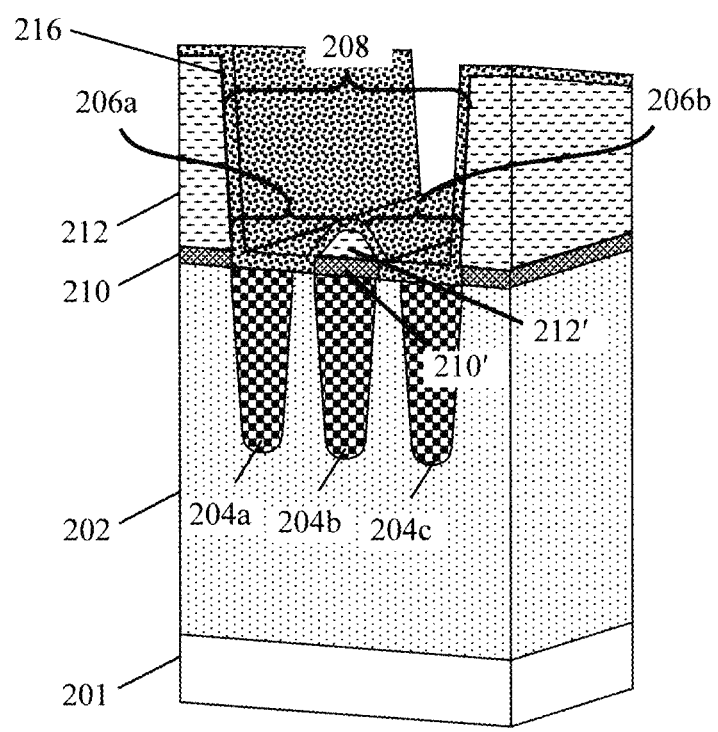
FIG. 6 is a three-dimensional diagram illustrating a conformal spacer having been deposited onto the second dielectric lining the vias and the trench according to an embodiment of the present invention.

Advantageously, steps will now be undertaken to form the protective dielectric arch 214 on these patterned portions 212'/210' of the second dielectric 212/etch stop liner 210 providing additional coverage over the center metal line 204b, as well as regulating the dimensions of the vias 206a and 206b. To form the protective dielectric arch 214, a conformal spacer 216 is first deposited onto the second dielectric 212 lining the vias 206a/206b and trench 208. See FIG. 6. As shown in FIG. 6, as deposited the conformal spacer 216 covers the patterned portions 212'/210' of the second dielectric 212/etch stop liner 210 over the center metal line 204b, and directly contacts the left and right metal lines 204a and 204c to either side of the center metal line 204b.

As provided above, suitable materials for the spacer 216 include, but are not limited to, nitride spacer materials such as SiN, SiCN and/or SiOCN. A process such as CVD, ALD or PVD can be used to deposit the spacer 216. According to an exemplary embodiment, conformal spacer 216 has a thickness of from about 2 nm to about 8 nm and ranges therebetween.

Figure 7:
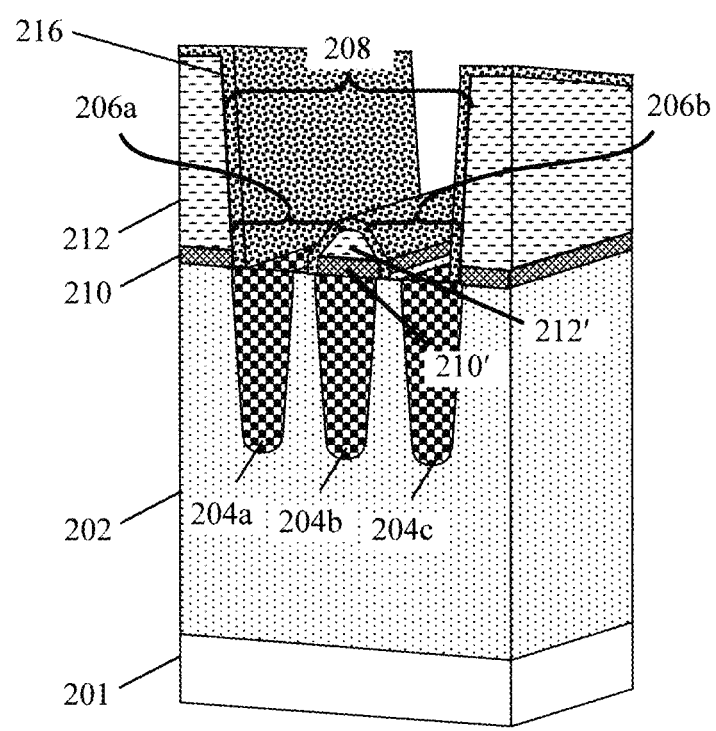
FIG. 7 is a three-dimensional diagram illustrating an etch back of spacer having been performed which removes the spacer from the tops of the left and right metal lines according to an embodiment of the present invention.

Next, as shown in FIG. 7, an etch back of spacer 216 is performed. Ultimately, the goal is to clear the spacer 216 from all but the patterned portions 212'/210' of the second dielectric 212/etch stop liner 210 over the center metal line 204b. That way, direct contact can be provided between the interconnect (formed in vias 206a/206b and trench 208) and the left and right metal lines 204a and 204c. At this stage, the etch back removes the spacer 216 from the tops of the left and right metal lines 204a and 204c. According to an exemplary embodiment, a directional spacer etch back is employed which will remove the material covering the bottom of the via faster than the sloped sidewalls.

Figure 8:
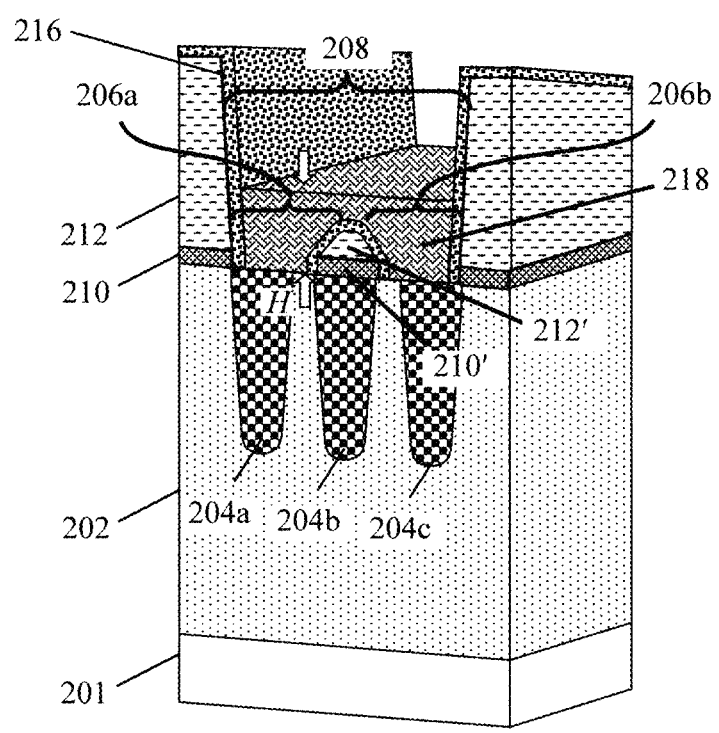
FIG. 8 is a three-dimensional diagram illustrating a dielectric cap having been deposited into the vias and the trench over spacer, and then recessed according to an embodiment of the present invention.

Spacer 216 is one component of the protective dielectric arch 214. The second component of the protective dielectric arch 214 is a dielectric cap 218. See FIG. 8. As shown in FIG. 8, the dielectric cap 218 is deposited into the vias 206a/206b and trench 208 over spacer 216 and then recessed. Since spacer 216 has been cleared from the left and right metal lines 204a and 204c (see etch back of spacer 216 depicted in FIG. 7 and described above), the dielectric cap 218 deposited into the vias 206a/206b directly contacts the left and right metal lines 204a and 204c to either side of the center metal line 204b.

According to an exemplary embodiment, dielectric cap 218 is formed from a flowable dielectric such as a flowable oxides, e.g., HSQ in a solvent such as MIBK. Flowable dielectrics such as HSQ in MIBK can be deposited using a casting process such as spin-coating, followed by an anneal to remove the solvent (e.g., at a temperature of from about 100° C. to about 175° C. and ranges therebetween). A selective etching process, such as a wet etch in hydrofluoric (HF) acid, is then used to recess the dielectric cap 218.

Recessing dielectric cap 218 controls a height H of the protective dielectric arch 214. See FIG. 8. A subsequent pullback etch used to set the width W of the protective dielectric arch 214 (see below) will also further reduce the height. Thus, the recessing performed at this stage should be endpointed when dielectric cap 218 is slightly taller than its desired final height to account for the further reduction that will occur at pullback.

Figure 9:
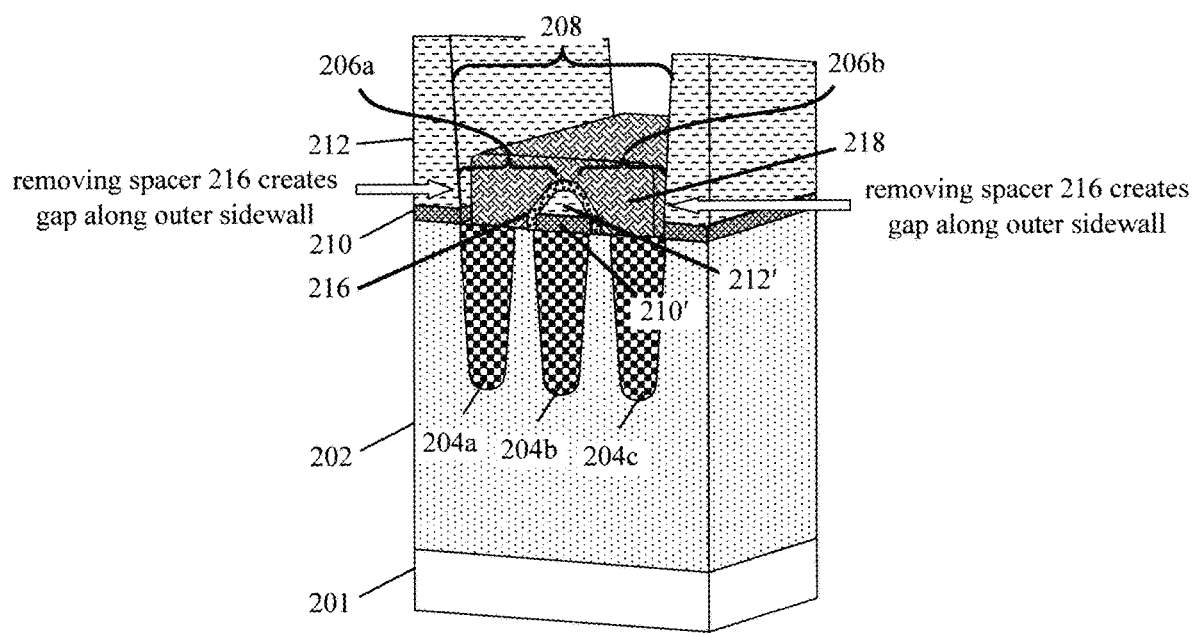
FIG. 9 is a three-dimensional diagram illustrating the spacer having been removed from the outer sidewalls of the vias and the trench to create a gap between the dielectric cap and the outer sidewalls of the vias and the trench according to an embodiment of the present invention.

In order to access the dielectric cap 218 for the pullback etch, spacer 216 is removed from the outer sidewalls of the vias 206a/206b and trench 208. See FIG. 9. As shown in FIG. 9, doing so creates a gap between the dielectric cap 218 and the outer sidewalls of the vias 206a/206b and trench 208. It is through this gap that an etchant will access the sides of the dielectric cap 218 during the pullback etch of dielectric cap 218 away from the left and right metal lines 204a and 204c. As also shown in FIG. 9, spacer 216 now only remains beneath the dielectric cap 218 on top of the patterned portions 212'/210' of the second dielectric 212/etch stop liner 210 over the center metal line 204b.

According to an exemplary embodiment, spacer 216 is removed from the outer sidewalls of the vias 206a/206b and trench 208 using a non-directional (i.e., isotropic) etching process such as a nitride-selective wet chemical etching process. By way of example only, a wet chemical etch in phosphoric acid would be selective for a nitride-based spacer 216 over the oxide dielectrics such as second dielectric 212 and dielectric cap 218.

Figure 10:
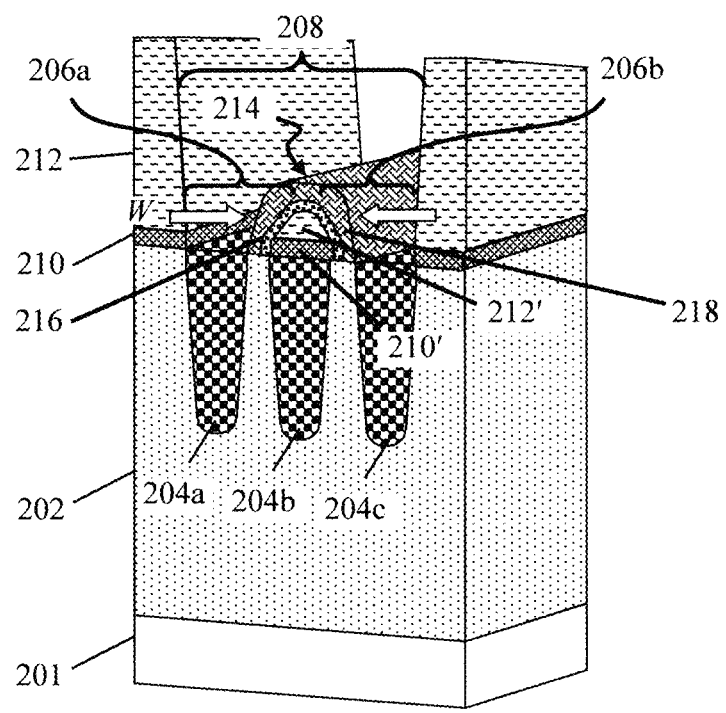
FIG. 10 is a three-dimensional diagram illustrating a pullback etch of the dielectric cap having been performed, including in the gap, such that the spacer and the dielectric cap form a protective dielectric arch on the portions of the second dielectric and the etch stop liner over the center metal line according to an embodiment of the present invention.

A pullback etch of the dielectric cap 218 is then performed. See FIG. 10. As shown in FIG. 10, this pullback etch reduces a width W of the dielectric cap 218 such that dielectric cap 218 is no longer covering the left and right metal lines 204a and 204c (i.e., dielectric cap 218 only covers the center metal line 204b). Namely, as highlighted above, the goal is to create an interconnect that selectively contacts the left and right metal lines 204a and 204c but not the center metal line 204b, i.e., the interconnect is in a contact position with the left and right metal lines 204a and 204c and in a non-contact position with the center metal line 204b. As shown in FIG. 10, the left and right metal lines 204a and 204c are now exposed at the bottoms of the vias 206a and 206b, respectively. The center metal line 204b, however, is covered by portions 212'/210' of the second dielectric 212/etch stop liner 210 over which the protective dielectric arch 214 (formed by spacer 216 and dielectric cap 218) is disposed. As described in conjunction with the description of FIG. 2 and FIG. 3 above, protective dielectric arch 214 controls the CD of vias 206a and 206b, as well as the chamfer angle. Without this protective dielectric arch 214, an excessive chamfer angle can undesirably lead to shorts between the adjacent metal lines 204a,b,c.

According to an exemplary embodiment, the pullback etch of the dielectric cap 218 is performed using a non-directional (i.e., isotropic) etching process such as a wet chemical etching process. As provided above, wet chemical etchants such as HF are suitable for flowable dielectrics such as HSQ/MIBK.

Next, the vias 206a/206b and trench 208 are filled with a metal or combination of metals to form interconnect 1102. See FIG. 11. Suitable metals include, but are not limited to, Cu, Au, Ni, Pt, Pd and/or Co. The metal can be deposited by a process such as evaporation, sputtering, or electroplating. Following deposition, the metal overburden is removed using a process such as CMP. Although not explicitly shown in the figures, prior to depositing the metal into the vias 206a/206b and trench 208, a liner/barrier layer can be deposited into and lining the vias 206a/206b and trench 208. Suitable liner/barrier materials include, but are not limited to, Ti, Ta, TiN and/or TaN.

Figure 11:
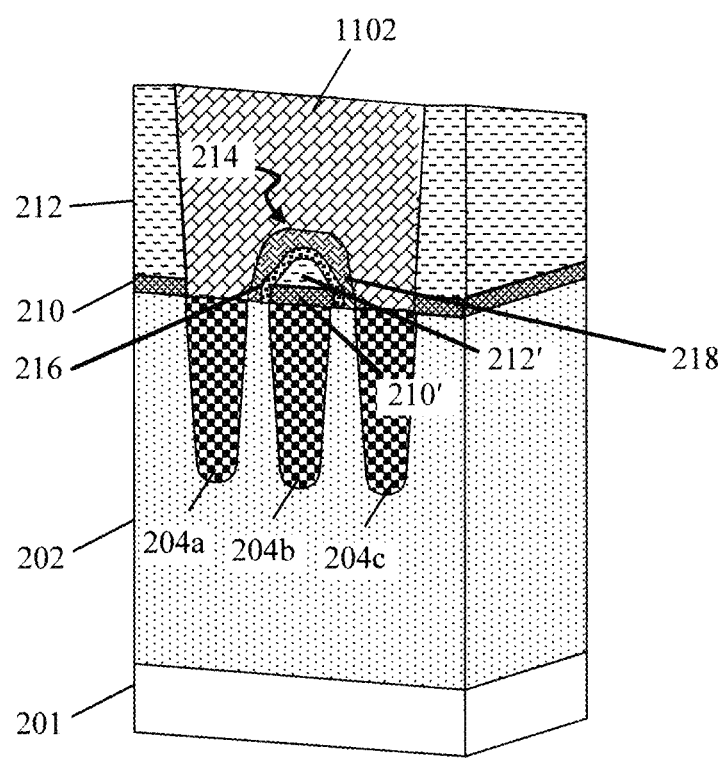
FIG. 11 is a three-dimensional diagram illustrating the vias and the trench having been filled with a metal(s) to form an interconnect that is in direct contact with the left and right metal lines, and in a non-contact position with the center metal line according to an embodiment of the present invention.

As shown in FIG. 11, interconnect 1102 directly contacts (i.e., is in a contact position with) the left and right metal lines 204a and 204c. Protective dielectric arch 214 covers center metal line 204b, thus preventing contact between interconnect 1102 and center metal line 204b (i.e., interconnect 1102 is in a non-contact position with center metal line 204b). Further, protective dielectric arch 214 controls the chamfer angle, thereby preventing shorts between the adjacent metal lines 204a,b,c.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an interconnect, the method comprising the steps of:
    forming metal lines in a first dielectric;
    depositing an etch stop liner onto the first dielectric over the metal lines;
    depositing a second dielectric on the etch stop liner over the metal lines;
    patterning vias and a trench in the second dielectric, wherein the vias are present over at least one of the metal lines and the trench is present over the vias, and wherein the patterning forms patterned portions of the second dielectric and the etch stop liner over at least another one of the metal lines;
    forming a protective dielectric arch on the patterned portions of the second dielectric and the etch stop liner over the at least another one of the metal lines; and
    filling the vias and the trench with at least one metal to form the interconnect in direct contact with the at least one of the metal lines and, due to the protective dielectric arch, in a non-contact position with the at least another one of the metal lines.

2. The method of claim 1, wherein the etch stop liner comprises a material selected from the group consisting of: silicon nitride (SiN), silicon carbonitride (SiCN), silicon oxycarbonitride (SiOCN), and combinations thereof.

3. The method of claim 1, wherein the etch stop liner has a thickness of from about 5 nm to about 15 nm and ranges therebetween.

4. The method of claim 1, wherein the first dielectric and the second dielectric each comprises a material selected from the group consisting of: silicon oxide (SiOx), organosilicate glass (SiCOH), porous organosilicate glass (pSiCOH) and combinations thereof.

5. The method of claim 1, wherein the metal lines comprise at least a first metal line, a second metal line, and a third metal line, and wherein the metal lines are formed adjacent to one another in the first dielectric with the second metal line formed in between the first metal line and the third metal line.

6. The method of claim 5, wherein the protective dielectric arch is formed over the second metal line such that the interconnect is in direct contact with the first metal line and the third metal line, and in a non-contact position with the second metal line.

7. The method of claim 1, wherein the protective dielectric arch reduces a chamfer angle of the vias from $\theta_1$ to $\theta_2$, wherein $\theta_2 < \theta_1$.

8. The method of claim 1, wherein the step of forming the protective dielectric arch comprises the steps of:
depositing a conformal spacer onto the second dielectric lining the vias and the trench;
depositing a dielectric cap into the vias and the trench over the conformal spacer;
removing the conformal spacer from outer sidewalls of the vias and the trench to create a gap between the dielectric cap and the outer sidewalls of the vias and the trench; and
performing a pullback etch of the dielectric cap, including in the gap, such that following the pullback etch the dielectric cap covers only the at least another one of the metal lines,
wherein the conformal spacer and the dielectric cap form the protective dielectric arch on the patterned portions of the second dielectric and the etch stop liner over the at least another one of the metal lines.

9. The method of claim 8, wherein the conformal spacer comprises a material selected from the group consisting of: SiN, SiCN, SiOCN, and combinations thereof.

10. The method of claim 8, further comprising the step of:
removing the conformal spacer from the at least one of the metal lines.

11. The method of claim 8, wherein the dielectric cap comprises a flowable dielectric.

12. The method of claim 8, further comprising the step of:
recessing the dielectric cap.

13. A method of forming an interconnect, the method comprising the steps of:
forming metal lines in a first dielectric;
depositing an etch stop liner onto the first dielectric over the metal lines;
depositing a second dielectric on the etch stop liner over the metal lines;
patterning vias and a trench in the second dielectric, wherein the vias are present over at least one of the metal lines and the trench is present over the vias, and wherein the patterning forms patterned portions of the second dielectric and the etch stop liner over at least another one of the metal lines;
depositing a conformal spacer onto the second dielectric lining the vias and the trench;
depositing a dielectric cap into the vias and the trench over the conformal spacer;
removing the conformal spacer from outer sidewalls of the vias and the trench to create a gap between the dielectric cap and the outer sidewalls of the vias and the trench;
performing a pullback etch of the dielectric cap, including in the gap, such that following the pullback etch the dielectric cap covers only the at least another one of the metal lines, wherein the conformal spacer and the dielectric cap form a protective dielectric arch on the patterned portions of the second dielectric and the etch stop liner over the at least another one of the metal lines; and
filling the vias and the trench with at least one metal to form the interconnect in direct contact with the at least one of the metal lines and, due to the protective dielectric arch, in a non-contact position with the at least another one of the metal lines.

14. The method of claim 13, wherein the metal lines comprise at least a first metal line, a second metal line, and a third metal line, and wherein the metal lines are formed adjacent to one another in the first dielectric with the second metal line formed in between the first metal line and the third metal line.

15. The method of claim 14, wherein the protective dielectric arch is formed over the second metal line such that the interconnect is in direct contact with the first metal line and the third metal line, and in a non-contact position with the second metal line.

16. The method of claim 13, further comprising the step of:
removing the conformal spacer from the at least one of the metal lines.

17. The method of claim 13, further comprising the step of:
recessing the dielectric cap.

* * * * *